(12) United States Patent
Jeong et al.

(10) Patent No.: US 12,178,079 B2
(45) Date of Patent: Dec. 24, 2024

(54) DISPLAY DEVICE

(71) Applicant: LG DISPLAY CO., LTD., Seoul (KR)

(72) Inventors: DukYoung Jeong, Seoul (KR); YuHo Jung, Gyeonggi-do (KR); Seonha Yu, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/212,682

(22) Filed: Jun. 21, 2023

(65) Prior Publication Data

US 2023/0337469 A1    Oct. 19, 2023

Related U.S. Application Data

(63) Continuation of application No. 17/354,579, filed on Jun. 22, 2021, now Pat. No. 11,723,233.

(30) Foreign Application Priority Data

Oct. 6, 2020   (KR) .......................... 10-2020-0128782

(51) Int. Cl.
| | | |
|---|---|---|
| *H10K 59/12* | (2023.01) | |
| *H10K 59/121* | (2023.01) | |
| *H10K 77/10* | (2023.01) | |
| *H01L 27/12* | (2006.01) | |

(52) U.S. Cl.
CPC ......... *H10K 59/1213* (2023.02); *H10K 77/10* (2023.02); *H01L 27/1225* (2013.01)

(58) Field of Classification Search
CPC . H10K 59/1213; H10K 77/10; H01L 27/1225
USPC .......................................................... 257/43
See application file for complete search history.

(56) References Cited

U.S. PATENT DOCUMENTS

| | | | |
|---|---|---|---|
| 2008/0180024 A1* | 7/2008 | Kwon ................... | H10K 59/12 445/24 |
| 2009/0039773 A1* | 2/2009 | Jun ..................... | H10K 59/8723 313/504 |
| 2013/0248867 A1* | 9/2013 | Kim ..................... | H10K 50/844 438/34 |
| 2017/0214003 A1 | 7/2017 | Lee et al. | |
| 2017/0237038 A1 | 8/2017 | Kim et al. | |
| 2018/0069063 A1 | 3/2018 | Kim et al. | |
| 2019/0355799 A1 | 11/2019 | Jeong et al. | |
| 2020/0273927 A1 | 8/2020 | Oh et al. | |

\* cited by examiner

*Primary Examiner* — Dzung Tran
(74) *Attorney, Agent, or Firm* — Morgan, Lewis & Bockius LLP (57) ABSTRACT

Embodiments of the present disclosure relate to a display device including a substrate, an optical device located under the substrate in a display area, and a subpixel layer located over the substrate in the display area, wherein the subpixel layer includes at least one of first transistor with a first characteristic are located at a first area overlapping with the optical device, and at least one of second transistor with a second characteristic are located at a second area not overlapping with the optical device.

20 Claims, 10 Drawing Sheets

Area Y

DISPLAY DEVICE

CROSS REFERENCE TO RELATED APPLICATION

This application is a continuation of U.S. Application Ser. No. 17/354,579, filed Jun. 22, 2021, which claims priority from Korean Patent Applications No. 10-2020-0128782, filed on Oct. 6, 2020, which are hereby incorporated by reference for all purposes as if fully set forth herein.

BACKGROUND

Technical Field

Embodiments relate to a display device, and more particularly relate to a display capable of improving a transmittance of a camera area.

Discussion of Related Art

With the development of multimedia, the importance of flat panel display devices is increasing. In response to this, flat panel display devices such as a Liquid Crystal Display and an Organic Light Emitting Display are commercially available.

The display device provides an input method using a touch sensor or the like, and an optical device such as a camera and a proximity sensor to provide a variety of application functions to the user. Due to this, there is a problem that the design of the display device becomes more complicated.

In particular, since the camera and the proximity sensor are located to be exposed to the outside for the entrance and exit of light, there is a problem in that the display area of the display panel must be reduced.

Accordingly, in the related art, the display device is manufactured as a design having a large bezel for installation and exposure of the optical device, or as a design in which the display panel is cut out in a notch shape.

However, there is a problem that the large bezel of the display panel increases the size of the display panel and the notch shape of the camera area induces a poor design due to exposure of the camera.

Accordingly, in recent years, research has been conducted to arrange the camera so as to overlap the display area inside the display panel.

However, when the camera is disposed so as to overlap the display area, it is difficult not only to improve the transmittance of the area where the camera is disposed, but also to implement high luminance at a low resolution.

SUMMARY

Accordingly, embodiments of the present disclosure are directed to a display device that substantially obviates one or more of the problems due to limitations and disadvantages of the related art.

An aspect of the present disclosure is to provide a display device capable of improving the transmittance of the camera area while arranging the camera so as to overlap the display area inside the display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate, an optical device located under the substrate in a display area, and a subpixel layer located over the substrate in the display area. The subpixel layer includes at least one of first transistor with a first characteristic are located at a first area overlapping with the optical device, and at least one of second transistor with a second characteristic are located at a second area not overlapping with the optical device.

In the display device according to an embodiment of present disclosure, an area corresponding to the first area in the substrate may be formed of transparent polyimide.

In the display device according to an embodiment of present disclosure, the substrate may include a first substrate, a second substrate, and an interlayer insulating layer interposed between the first substrate and the second substrate.

In the display device according to an embodiment of present disclosure, an area corresponding to the second area in the first substrate or the second substrate may be formed of color polyimide.

In the display device according to an embodiment of present disclosure, the optical device may include at least one of a camera or a proximity sensor.

In the display device according to an embodiment of present disclosure, the first transistor and the second transistor may have different electrical characteristic with each other.

In the display device according to an embodiment of present disclosure, the electrical characteristic may be determined by a length and a width of a channel.

In the display device according to an embodiment of present disclosure, the first transistor may be a oxide transistor, and the second transistor may be a low-temperature polycrystalline silicon transistor.

In the display device according to an embodiment of present disclosure, a number of subpixels per unit area in the first area may be less than a number of subpixels per unit area in the second area.

In the display device according to an embodiment of present disclosure, subpixels disposed in the first area include at least one of subpixel group composed of two or more subpixels.

In the display device according to an embodiment of present disclosure, a separation distance between the subpixel groups may be greater than a separation distance between two or more subpixels included in each of the subpixel group.

In the display device according to an embodiment of present disclosure, the first transistor and the second transistor are formed on different layers.

According to the embodiments of the present disclosure, there is an effect of manufacturing a display device capable of improving the transmittance of the camera area while arranging the camera so as to overlap the display area inside the display panel.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

The advantages and features of the present disclosure and methods of the realization thereof will be apparent with reference to the accompanying drawings and detailed descriptions of the embodiments. The present disclosure should not be construed as being limited to the embodiments set forth herein and may be embodied in a variety of different forms. Rather, these embodiments are provided so that the present disclosure will be thorough and complete, and will fully convey the scope of the present disclosure to those having ordinary knowledge in the technical field. The scope of the present disclosure shall be defined by the appended claims.

The shapes, sizes, ratios, angles, numbers, and the like, inscribed in the drawings to illustrate exemplary embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise", "include", "have", and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as "on", "above", "under", "below", and "on a side of", are used herein for descriptions of relationships between one element or component and another element or component, one or more intervening elements or components may be present between the one and other elements or components, unless a term, such as "directly", is used.

When temporally relative terms, such as "after", "subsequent", "following", and "before" are used to define a temporal relationship, a non-continuous case may be included unless the term "immediately" or "directly" is used.

In descriptions of signal transmission, such as "a signal is sent from node A to node B", a signal may be sent from node A to node B via another node unless the term "immediately" or "directly" is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of exemplary embodiments of the present disclosure may be partially or entirely coupled or combined with each other and may work in concert with each other or may operate in a variety of technical methods. In addition, respective exemplary embodiments may be carried out independently or may be associated with and carried out in concert with other embodiments.

Hereinafter, a variety of embodiments will be described in detail with reference to the accompanying drawings.

Figure 1:
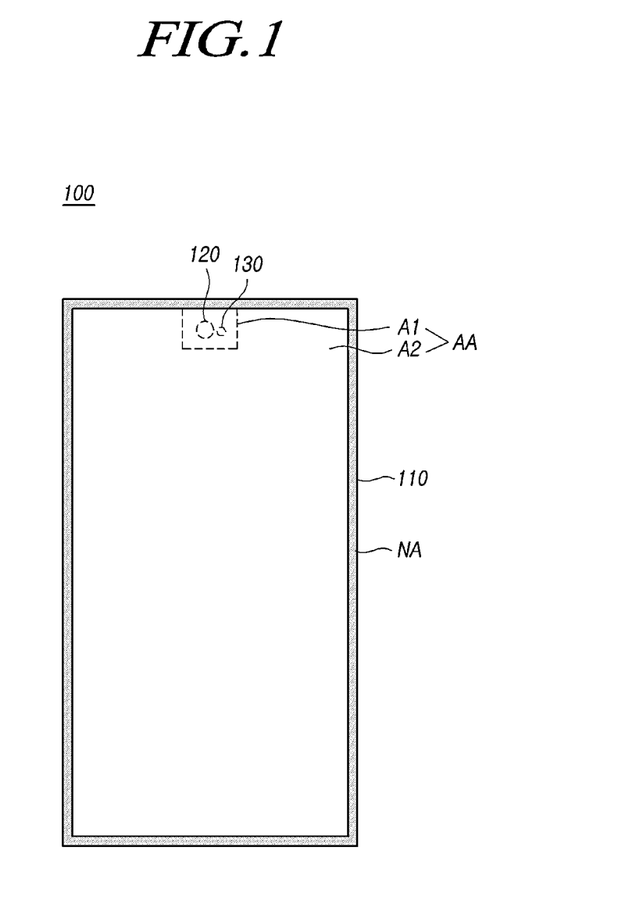
FIG. 1 illustrates a block diagram of a display device according to an embodiment of present disclosure.

FIG. 1 illustrates a block diagram of a display device according to an embodiment of present disclosure.

Referring to FIG. 1, the display device 100 according to an embodiment of the present disclosure may include a display panel 110 displaying an image and a case (not shown) protecting the display panel 110.

When a user views the front surface of the display device 100, a part of the case may be shown in the outer area of the display panel 110, but in some cases, if the display device 100 is implemented in a full-display type, the case may be invisible or almost invisible.

The display panel 110 may include a display area AA in which an image is displayed and a non-display area NA which may be an outer area of the display area AA without displaying an image.

The display area AA may include a first area A1 in which the camera 120 for taking an image is disposed, and a second area A2 corresponding to all other areas other than the first area A1.

For example, when a user holds the display device 100 and takes a self-image, the user may take a picture looking at the first area A1. In this case, a proximity sensor 130 may be disposed together with the camera 120 in the first area A1 for detecting a human body or an object approaching from surrounding area.

The first area A1 in the display area AA may be a path (light incident area) through which light enters into the camera 120. Here, the light may be an electromagnetic wave such as visible light, infrared light, or ultraviolet light.

The camera 120 or the proximity sensor 130 may overlap the first area A1 by being located below the first area A1.

The second area A2 may correspond to all areas other than the first area A1 in which the camera 120 or the proximity sensor 130 is disposed among the display area AA displaying an image.

The first area A1 may be located in a central upper area within the display area AA, and the first area A1 may be surrounded by the second area A2. For example, when the first area A1 has a square shape, the first area A1 may be surrounded by the second area A2 in four directions.

The display device 100 according to an embodiment of the present disclosure may sense a touch by a finger or a pen or may sense a fingerprint in the display area AA of the display panel 110. That is, the display device 100 according to an embodiment of the present disclosure may provide a touch sensing function or a fingerprint sensing function in the front area of the display device 100.

Figure 2:
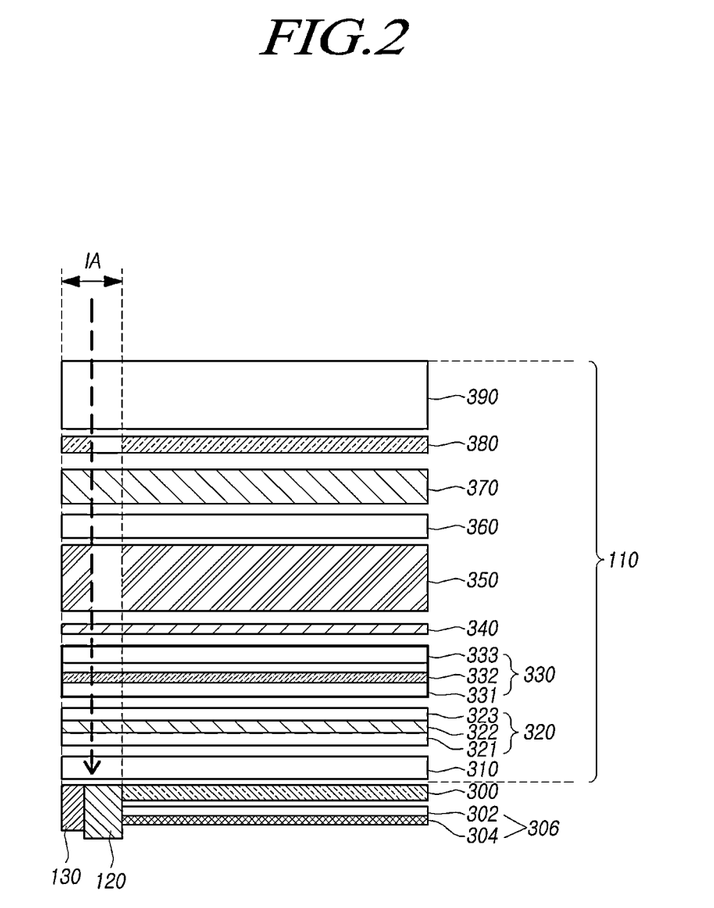
FIG. 2 illustrates a cross-sectional view of the display device according to an embodiment of present disclosure.

FIG. 2 illustrates a cross-sectional view of the display device according to an embodiment of present disclosure.

Referring to FIG. 2, the display device 100 according to an embodiment of the present disclosure may include an optical device such as a camera 120 and a proximity sensor 130 located under the display panel 110 overlapping the display area AA of the display panel 110.

Accordingly, the display device 100 may provide a function to take an image for the camera 120 and a function to sense for the proximity sensor 130 together with a function to display an image through the display panel 110.

For the above purpose, the display device 100 may include a light incident area IA in which light enters into the display area AA for the function of an optical device.

The display panel 110 may include a substrate 320, a subpixel layer 330 on which a plurality of subpixels are arranged, a cathode electrode layer 340 that is located on the subpixel layer 330 and a cathode voltage corresponding to a common voltage is applied, an encapsulation layer 350 located on the cathode electrode layer 340, and a touch sensor layer 360 that is located on the encapsulation layer 350 and includes a plurality of touch electrodes.

The substrate 320 corresponds to a base substrate constituting the display panel 110, and may be consist of a transparent polyimide to reduce color differential distortion of the camera 120 located below and to improve a transmittance in the visible light region.

In addition, the substrate 320 may have a certain thickness to prevent moisture from penetrating into the upper subpixel layer 330, and may have a stacked structure that an interlayer insulating layer 322 is interposed between a lower first substrate 321 and an upper second substrate 323.

The subpixel layer 330 may include a transistor array 331, an anode electrode layer 332, and a light emitting layer 333. The transistor array 331 may be located over the substrate 320 in the display area AA, and include one or more transistors disposed in each of the plurality of subpixels. The anode electrode layer 332 may be disposed on the transistor array 331 and include an anode electrode electrically connected to a source node or a drain node of transistor corresponding to the plurality of subpixels. The light emitting layer 333 may be located over the corresponding anode electrode on the anode electrode layer 332 in each of the plurality of subpixels.

The cathode electrode layer 340 may be located on the light emitting layer 333. The anode electrode 332, the light emitting layer 330, and the cathode electrode layer 340 form a light emitting element (e.g., organic light emitting diode) for each of the plurality of subpixels.

The touch sensor layer 360 may include a plurality of touch electrodes, and may further include a plurality of touch lines electrically connected to all or part of the plurality of touch electrodes.

For example, the plurality of touch electrodes may be disposed on one layer or may be divided and disposed on two or more layers separated by an insulating layer. The plurality of touch lines may be located on a different layer from the plurality of touch electrodes, or may be located on the same layer as some of the plurality of touch electrodes.

The plurality of touch electrodes may be disposed in the display area AA. Each of the plurality of touch lines may electrically connect a corresponding touch electrode located in the display area AA and a pad portion located in the non-display area NA. Accordingly, a plurality of touch lines may pass through the non-display area NA and may be electrically connected to the pad portion extending along the inclined surface of the encapsulation layer 350.

The display device 100 according to an embodiment of the present disclosure may further include a polarizing plate 370 disposed on the touch sensor layer 360, an optical transparent adhesive 380 disposed on the polarizing plate 370, and a cover glass 390 disposed on the optical transparent adhesive 380.

The display device 100 according to an embodiment of the present disclosure may further include a fingerprint sensor panel 300 located under the display panel 100. That is, the fingerprint sensor panel 300 may be located under the substrate 320.

A fingerprint sensing performance through the fingerprint sensor panel 300 may be diminished or the fingerprint sensing operation may be impossible when an air layer is present between the display panel 100 and the fingerprint sensor panel 300. Accordingly, the display panel 100 and the fingerprint sensor panel 300 may be bonded with a bonding material (e.g., resin, optical clear adhesive, pressure sensitive adhesive, or the like).

In addition, the display device 100 according to an embodiment of the present disclosure may further include a back plate 310 located between the display panel 100 and the fingerprint sensor panel 300. The display panel 100 may be bonded to the upper surface of the back plate 310, and the fingerprint sensor panel 300 may be bonded to the lower surface of the back plate 310. Here, the back plate 310 may not be an essential element.

The display device 100 according to an embodiment of the present disclosure further may include a cushion plate 306 located under the fingerprint sensor panel 300 for protecting a lower portion of the fingerprint sensor panel 300. The cushion plate 306 may include a foam pad 302 and a metal plate 304 composed of copper (Cu) or the like.

The display device 100 according to an embodiment of the present disclosure may include the optical device located under the substrate 320 in the display area AA. For example, the optical device may include one or more of the camera 120 and the proximity sensor 130.

The camera 120 and the proximity sensor 130 may be located in the first area A1 of the display area AA. That is, the camera 120 and the proximity sensor 130 may be overlapped with the first area A1 in the display area AA.

The light incident area IA may be a light path through which a visible light for taking an image by the camera 120 or a light (e.g., infrared light) for sensing by the proximity sensor 130 is transmitted. On a plane, the light incident area IA may correspond to the first area A1.

The first area A1 may be a camera area in which a lens of the camera 120 for taking an image is located, and may be a proximity sensing area capable of sensing an approach of an object or a human body. Accordingly, it is preferable that a light must be well transmitted through the first area A1.

For the above purpose, each of the layers 390, 380, 370, 360, 350, 340, 330, 320 and 310 located in the light incident area IA may have a transmittance of more than a predetermined threshold transmittance for effective function of the camera 120 and the proximity sensor 130 at the area corresponding to the first area A1.

Meanwhile, the first area A1 may be located in the display area AA, and may be located in the central area of the display area AA. In addition, the first area A1 may have a predetermined shape (e.g., polygons such as square and hexagon, circle, ellipse, or the like) on a plane.

Figure 3:
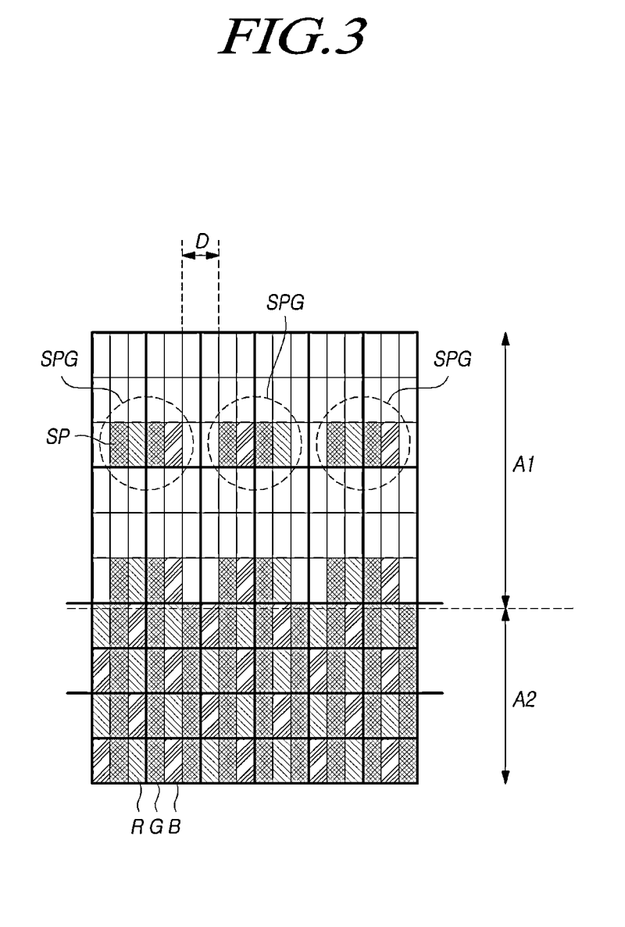
FIG. 3 illustrates a structural diagram showing an arrangement of subpixels in a first area in which a camera is disposed in a display panel of a display device according to an embodiment of the present disclosure.
Figure 4:
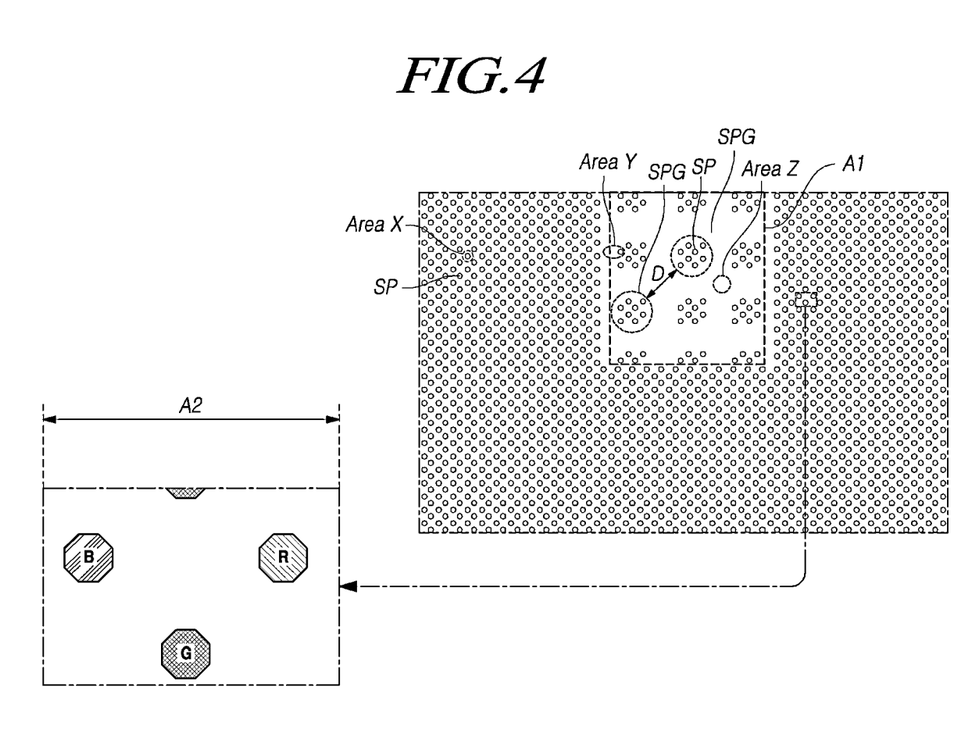
FIG. 4 illustrates a structural diagram showing an arrangement of the subpixels in a second area excluding the first area in the display panel of the display device according to an embodiment of the present disclosure.

FIG. 3 illustrates a structural diagram showing an arrangement of subpixels in a first area in which a camera is disposed in a display panel of a display device according to an embodiment of the present disclosure, and FIG. 4 illustrates a structural diagram showing an arrangement of the subpixels in a second area excluding the first area in the display panel of the display device according to an embodiment of the present disclosure.

Referring to FIG. 3, a plurality of subpixels SP constituting the display panel 110 in the display device 100 according to an embodiment of the present disclosure may include a red subpixel R emitting red light, a green subpixel G emitting green light, and a blue subpixel B emitting blue light.

Each of the plurality of subpixels SP may have a shape of a rectangle and may be arranged in a stripe form or a dot form.

Among the first area A1 and the second area A2 constituting the display area AA, the second area A2 may have a high resolution so as to display a vivid color image, whereas the first area A1 in which the camera 120 or the proximity sensor 130 is disposed may have a relatively low resolution so as to increase the transmittance of the incident light.

For the above purpose, a number of the subpixels SP per unit area in the first area A1 may be less than a number of subpixels SP per unit area in the second area A2.

On the other hand, the subpixels SP disposed in the first area A1 may constitute a subpixel group SPG including two or more subpixels SP. Here, a separation distance D between the subpixel groups SPG may be greater than a separation distance between two or more subpixels SP included in each of the subpixel group SPG.

Referring to FIG. 4, metal patterns such as the data line, the gate line, and the anode electrode for driving the subpixels SP may be disposed in the first area A1 even though fewer subpixels SP are arranged in the first area A1 than the second area A2. This may slightly degrade the transmittance of the first area A1. To compensate for this, the subpixel groups SPG in the first area A1 may be regularly arranged.

Accordingly, the transmittance of the first area A1 may be changed regularly and fairly throughout the first area A1. Therefore, a large drop of a performance for taking an image by the camera 120 or for sensing by the proximity sensor 130 may be diminished.

Meanwhile, the subpixel group SPG in the first area A1 may have a different number of subpixels SP according to colors. For example, a number of green subpixels G may be greater than a number of blue subpixels B and a number of red subpixels R in each of the subpixel groups SPG. For example, a subpixel group SPG may include one blue subpixel B, one red subpixel R, and two green subpixels G or may include two blue subpixels B, two red subpixels R, and four green subpixels G.

In below, it illustrates a cross-sectional structure of an area X Area X in which subpixels SP are disposed in the second area A2, an area Y Area Y in which subpixels SP are disposed in the first area A1, and an area Z Area Z in which the subpixels SP are not disposed in the first area A1. For reference, it illustrates a top gate structure for a driving transistor.

Figure 5:
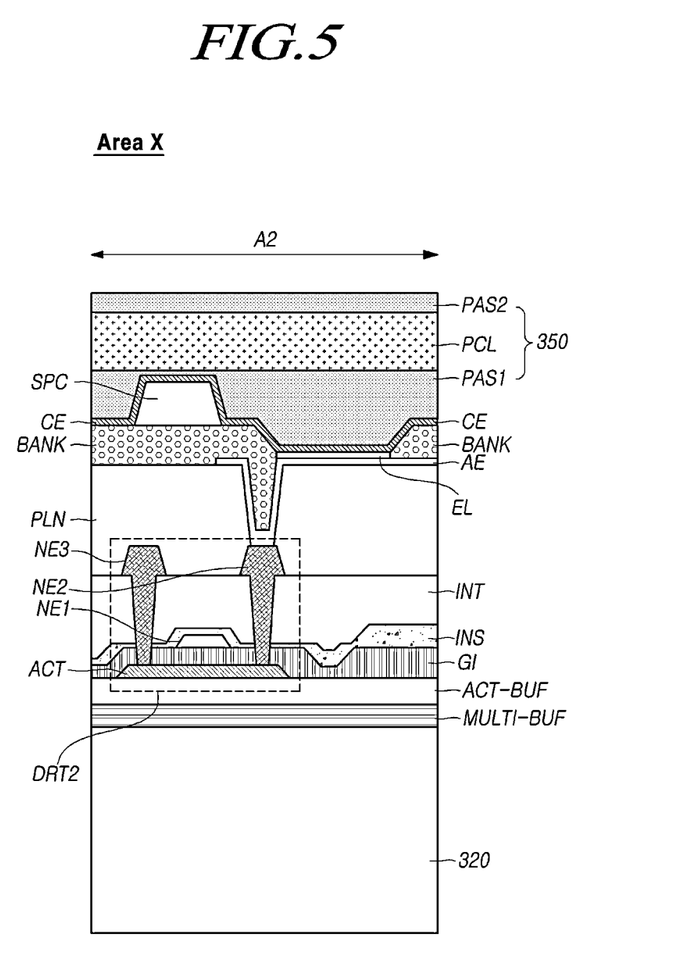
FIG. 5 illustrates a cross-sectional view of an area in which the subpixels are disposed in the second area of a display panel in a display device according to an embodiment of the present disclosure.

FIG. 5 illustrates a cross-sectional view of an area in which the subpixels are disposed in the second area of a display panel in a display device according to an embodiment of the present disclosure.

Referring to FIG. 5, a multi-buffer layer MULTI-BUF and an active-buffer layer ACT-BUF may be disposed on the substrate 320 in the area X Area X in which subpixels SP are located in the second area A2 of the display panel 110 in the display device 100 according to an embodiment of the present disclosure. An active layer ACT may be disposed on the active-buffer layer ACT-BUF.

A gate insulating layer GI may be disposed on the active layer ACT. A first node electrode NE1 corresponding to a gate electrode may be disposed on the gate insulating layer GI. An insulating layer INS may be disposed covering the first node electrode NE1. An interlayer INT may be disposed on the insulating layer INS. A triple contact hole may be formed for the interlayer INT, the insulating layer INS, and the gate insulating layer GI.

A second node electrode NE2 and a third node electrode NE3 made of a source-drain material may be disposed on the interlayer INT. The second node electrode NE2 and the third node electrode NE3 may be connected to the active layer ACT through the triple contact hole for the interlayer INT, the insulating layer INS, and the gate insulating layer GI.

A channel may be formed at an area that overlaps with the first node electrode NE1 corresponding to the gate electrode in the active layer ACT. An area that does not overlap the first node electrode NE1 may be a conductor area in the active layer ACT.

The active layer ACT, the first node electrode NE1, the second node electrode NE2, and the third node electrode NE3 may form a driving transistor DRT2 for driving the subpixel SP.

The driving transistor DRT2 located in the second area A2 may be composed of an oxide transistor including middle temperature oxide (MTO) or a low-temperature polycrystalline silicon (LTPS) transistor.

A planarization layer PLN may be disposed on the second node electrode NE2 and the third node electrode NE3. The anode electrode AE may be disposed on the planarization layer PLN. The anode electrode AE may be electrically connected to the second node electrode NE2 of the driving transistor DRT2 through a contact hole of the planarization layer PLN.

A bank BANK may be disposed in an area which is overlapped with a part of the anode electrode AE and overlapped with a part of the planarization layer PLN. The bank BANK may define a light emitting area of each subpixel SP.

A spacer SPC may be further disposed on the bank BANK.

A light emitting layer EL may be disposed on the anode electrode AE in an area where the bank BANK is opened. The cathode electrode CE may be disposed on the light emitting layer EL.

The encapsulation layer 350 including a first inorganic encapsulation layer PAST, an organic encapsulation layer PCL, and a second inorganic encapsulation layer PAS2 may be disposed on the cathode electrode CE.

Figure 6:
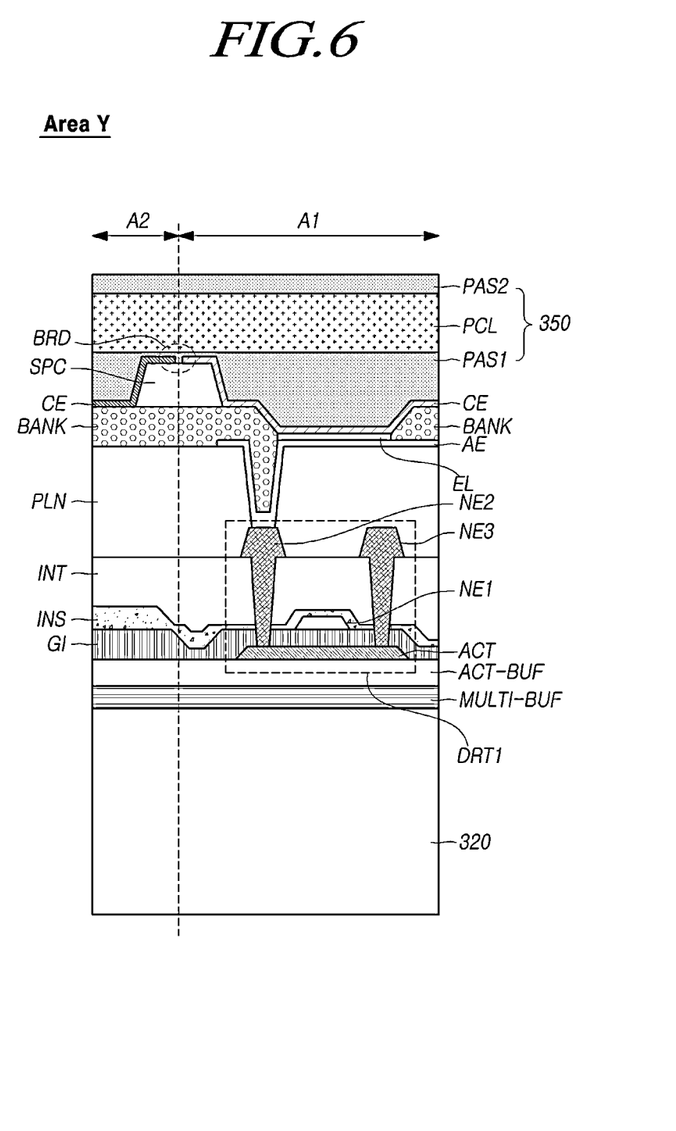
FIG. 6 illustrates a cross-sectional view of an area in which the subpixels are disposed in the first area of the display panel in the display device according to an embodiment of the present disclosure.

FIG. 6 illustrates a cross-sectional view of an area in which the subpixels are disposed in the first area of the display panel in the display device according to an embodiment of the present disclosure.

Referring to FIG. 6, a multi-buffer layer MULTI-BUF and an active-buffer layer ACT-BUF may be disposed on the substrate 320 in the area Y Area Y in which subpixels SP are located in the first area A1 of the display panel 110 in the display device 100 according to an embodiment of the present disclosure. The active layer ACT may be disposed on the active-buffer layer ACT-BUF.

In this case, the substrate 320 located in the first area A1, in which the camera 120 or the proximity sensor 130 is disposed, may be made of transparent polyimide in order to increase the transmittance of the incident light. On the other hand, the substrate 320 located in the second area A2, in which the camera 120 or the proximity sensor 130 is not disposed, may be made of a color polyimide having relatively low transmittance of light compared to the first area A1.

The gate insulating layer GI may be disposed on the active layer ACT. The first node electrode NE1 corresponding to the gate electrode may be disposed on the gate insulating layer GI. The insulating layer INS may be disposed covering the first node electrode NE1. The interlayer INT may be disposed on the insulating layer INS. A triple contact hole may be formed for the interlayer INT, the insulating layer INS, and the gate insulating layer GI.

The second node electrode NE2 and the third node electrode NE3 made of a source-drain material may be disposed on the interlayer INT. The second node electrode NE2 and the third node electrode NE3 may be electrically connected to the active layer ACT through the triple contact hole formed in the interlayer INT, the insulating layer INS, and the gate insulating layer GI.

The channel may be formed in an area which is overlapped with the first node electrode NE1 corresponding to the gate electrode in the active layer ACT. An area which is not overlapped with the first node electrode NE1 may be a conductor area in the active layer ACT.

The active layer ACT, the first node electrode NE1, the second node electrode NE2, and the third node electrode NE3 may form a driving transistor DRT1 in the first area A1 of the display panel 110.

The driving transistor DRT1 located in the first area A1 may be composed of an oxide transistor including middle temperature oxide (MTO) or a low-temperature polycrystalline silicon (LTPS) transistor.

When the driving transistor DRT1 in the first area A1 in which the camera 120 or the proximity sensor 130 are disposed, and the driving transistor DRT2 in the second area A2 have different electrical characteristics, it is possible to improve the transmittance of the first area A1 and simultaneously improve a display characteristic of the second area A2.

The planarization layer PLN may be disposed on the second node electrode NE2 and the third node electrode NE3. The anode electrode AE may be disposed on the planarization layer PLN. The anode electrode AE may be connected to the second node electrode NE2 of the driving transistor DRT1 through the contact hole of the planarization layer PLN.

The bank BANK may be disposed in an area which is overlapped with a part of the anode electrode AE and overlapped with a part of the planarization layer PLN. The bank BANK may define a light emitting area of each subpixel SP.

The spacer SPC may be further disposed on the bank BANK.

The light emitting layer EL may be disposed on the anode electrode AE in an area where the bank BANK is opened. The cathode electrode CE may be disposed on the light emitting layer EL.

In this case, the cathode electrode CE included in the cathode electrode layer 340 may have different transparency in the first area A1 and the second area A2, respectively.

The encapsulation layer 350 including a first inorganic encapsulation layer PAST, an organic encapsulation layer PCL, and a second inorganic encapsulation layer PAS2 may be disposed on the cathode electrode CE.

The bank BANK defines the light emitting area of each of the plurality of subpixels SP, and may be located between the anode electrode layer 332 in which the anode electrode AE is disposed in the plurality of subpixels SP and the cathode layer 340.

The spacer SPC may be disposed in a boundary area between the first area A1 and the second area A2 on the bank BANK. The boundary BRD of the cathode electrode CE disposed in the first area A1 and the cathode electrode CE disposed in the second area A2 may be located over the spacer SPC.

Figure 7:
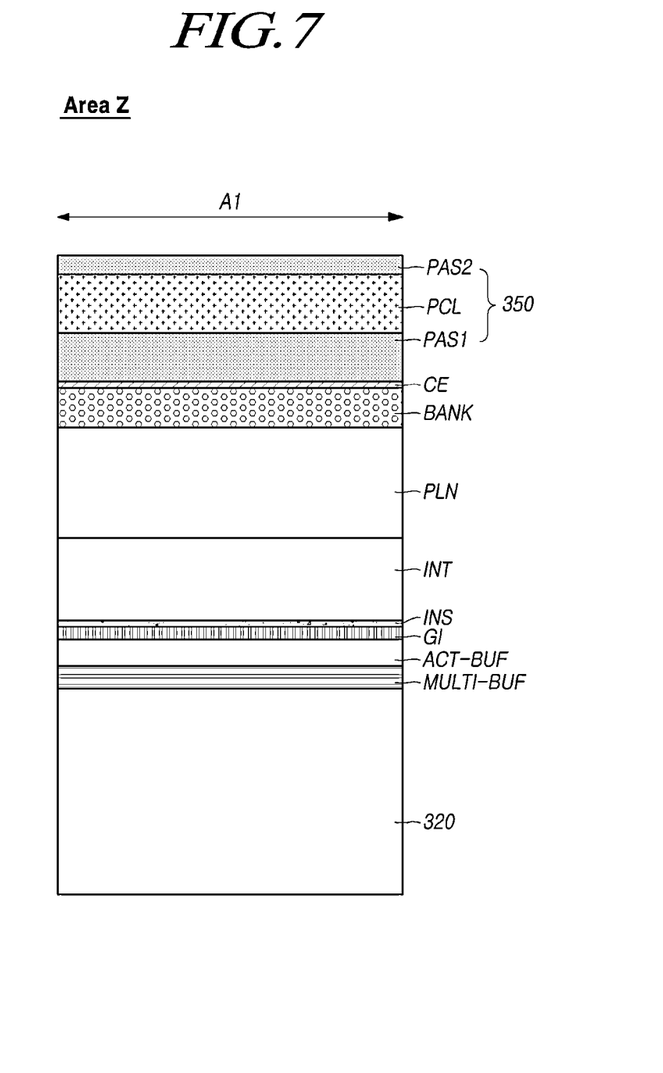
FIG. 7 illustrates a cross-sectional view of an area in which the subpixels are not disposed in the first area of the display panel in the display device according to an embodiment of the present disclosure.

FIG. 7 illustrates a cross-sectional view of an area in which the subpixels are not disposed in the first area of the display panel in the display device according to an embodiment of the present disclosure.

Referring to FIG. 7, the first area A1 of the display panel 110 may include a non-subpixel space in which the subpixel groups SPG are separated from each other in the display device 100 according to an embodiment of the present disclosure.

For this reason, the transistor DRT, a storage capacitor, the anode electrode AE, the light emitting layer EL and the like are not disposed in the non-subpixel area Area Z in which the subpixels SP do not exist. However, the cathode electrode CE having some transmittance may exist in the non-subpixel area Area Z.

The multi-buffer layer MULTI-BUF and the active-buffer layer ACT-BUF may be disposed on the substrate 320. The active layer ACT may be disposed on the active-buffer layer ACT-BUF.

The gate insulating layer GI may be disposed on the active layer ACT. The insulating layer INS and the interlayer INT may be disposed on the gate insulating layer GI.

The planarization layer PLN may be disposed on the interlayer INT. The bank BANK may be disposed on the planarization layer PLN. The cathode electrode CE may be disposed on the bank BANK.

The encapsulation layer 350 including a first inorganic encapsulation layer PAS1, an organic encapsulation layer PCL, a second inorganic encapsulation layer PAS2, and the like may be disposed on the cathode electrode CE.

Figure 8:
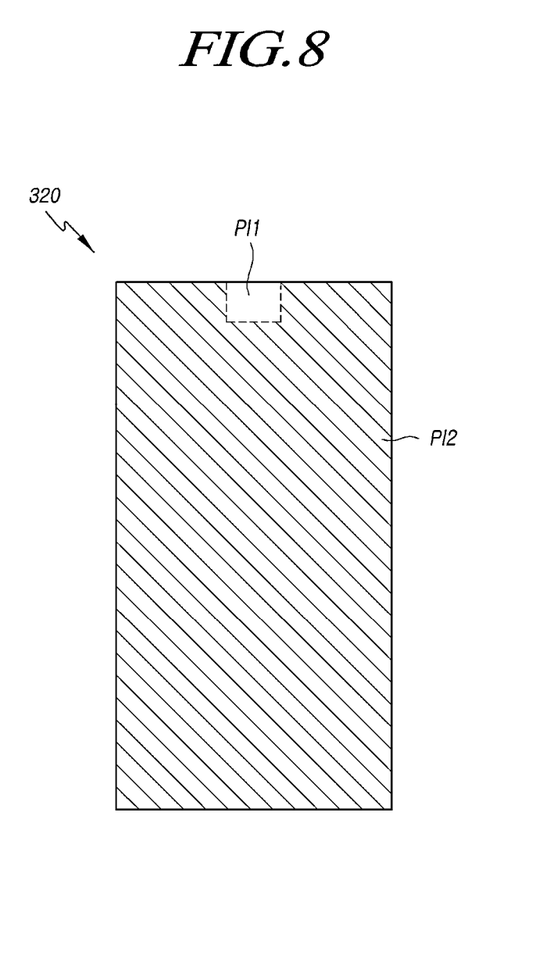
FIG. 8 illustrates a substrate of the display panel in the display device according to an embodiment of the present disclosure.
Figure 9:
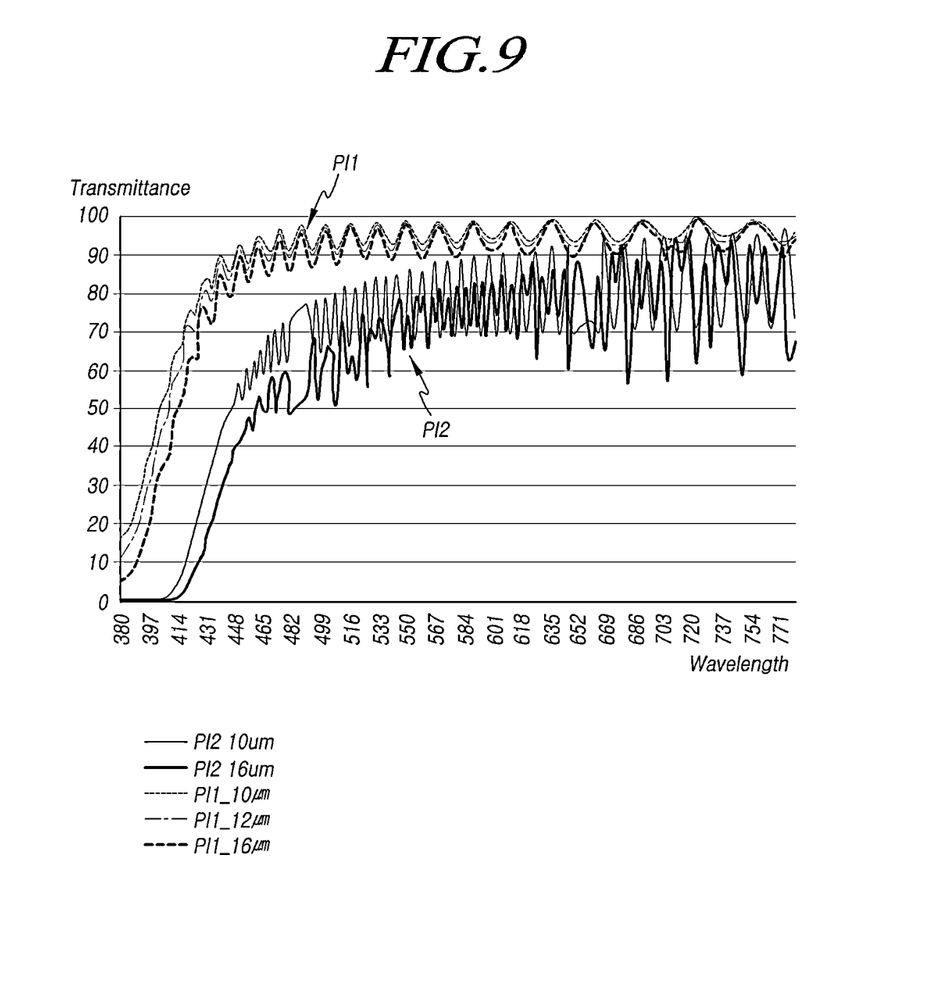
FIG. 9 illustrates spectra of the first area using a transparent polyimide as the substrate and the second area using a color polyimide as the substrate in the display device according to an embodiment of the present disclosure.

FIG. 8 illustrates a substrate of the display panel in the display device according to an embodiment of the present disclosure, and FIG. 9 illustrates spectra of the first area using a transparent polyimide as the substrate and the second area using a color polyimide as the substrate in the display device according to an embodiment of the present disclosure.

Referring to FIG. 8, the substrate 320 constituting the display panel 110 in the display device 100 according to an embodiment of the present disclosure may include the first area A1 in which the camera 120 or the proximity sensor 130 is disposed and the second area A2 in which the camera 120 and the proximity sensor 130 are not disposed, wherein the first area A1 and the second area A2 may be made of different materials.

For example, the substrate 320 of the first area A1 may be formed of a transparent polyimide PI1 in order to increase the transmittance of light incident on the first area A1 in which the camera 120 or the proximity sensor 130 is disposed. Also, the substrate 320 of the second area A2 in which the camera 120 and the proximity sensor 130 are not disposed may be formed of a color polyimide PI2.

Accordingly, the first area A1 in which the camera 120 or the proximity sensor 130 is disposed may have a transmittance greater than the second area A2 in which the camera 120 and the proximity sensor 130 are not disposed.

In this case, the first area A1 in which the camera 120 or the proximity sensor 130 is disposed may have a transmittance greater than predetermined threshold value in order to enable a function for taking an image by the camera 120 and a function for sensing by the proximity sensor 130.

Referring to FIG. 9, it can be seen that the variation in transmittance according to a thickness of the substrate 320 is very small when the substrate 320 of the first area A1, in which the camera 120 or the proximity sensor 130 is disposed, is formed of transparent polyimide PI1, unlike the second area A2 in which the substrate 320 is formed of the color polyimide PI2.

In particular, based on a case that the thickness of the substrate 320 is about 16 um and the incident light has a short wavelength in a blue region, the transparent polyimide PI1 has about twice transmittance of the color polyimide PI2. In addition, in a case of a long wavelength as well as a short wavelength, the transparent polyimide PI1 has a higher transmittance compared to the color polyimide PI2.

In addition, the display device 100 according to an embodiment of the present disclosure may improve the transmittance of the first area A1 by forming that the driving transistor DRT1 in the first area A1 in which the camera 120 or the camera 120 is disposed has different electrical characteristic from the driving transistor DRT2 in the second area A2 in which the camera 120 and the proximity sensor 130 are not disposed.

Figure 10:
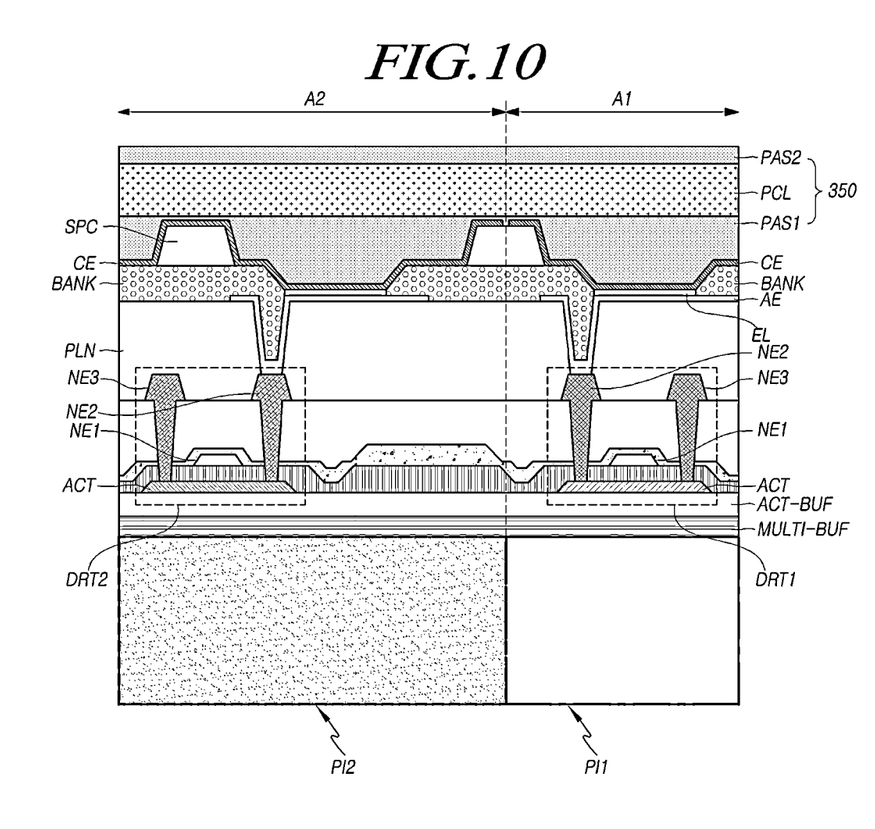
FIG. 10 illustrates a cross-sectional view of the first area and the second area of the display panel in the display device according to an embodiment of the present disclosure.

FIG. 10 illustrates a cross-sectional view of the first area and the second area of the display panel in the display device according to an embodiment of the present disclosure.

Referring to FIG. 10, the first transistor DRT1 formed in the first area A1 in which the camera 120 or the camera 120 is disposed may have different electrical characteristic from the second transistor DRT2 formed in the second area A2 in which the camera 120 and the proximity sensor 130 are not disposed in the display device 100 according to an embodiment of the present disclosure.

Specifically, the first transistor DRT1 formed in the first area A1 in which the camera 120 or the proximity sensor 130 is disposed may be made of a property or material capable of increasing the transmittance of incident light.

For example, the transmittance of incident light may be increased by changing the channel length and width of the first transistor DRT1 formed in the first area A1. Or the first transistor DRT1 may be formed of an oxide transistor with a transparent oxide material.

On the other hand, the second transistor DRT2 formed in the second area A2 in which the camera 120 and the proximity sensor 130 are not disposed does not need to have high transmittance. Thus, the second transistor DRT2 may have an appropriate length of the channel for the light emitting efficiency, or may be made of a material (e.g., an amorphous silicon transistor or an LTPS transistor, etc.) different from that of the oxide transistor.

In this case, the LTPS process of forming the LTPS transistor is a process performed at a relatively high temperature compared to a low temperature process of forming the oxide transistor. Accordingly, a color of the transparent polyimide disposed at a position adjacent to the LTPS transistor may be changed and the performance of the oxide transistor may be degraded due to the influence of high temperature in the process of forming the LTPS transistor.

Accordingly, when the first transistor DRT1 disposed in the first area A1 in which the camera 120 or the proximity sensor 130 is disposed is formed of an LTPS transistor, the color of the substrate 320 made of the transparent polyimide PI1 may be changed and the transmittance of light may be degraded. Therefore, it is preferable that the first transistor DRT1 disposed in the first area A1 is formed of an oxide transistor.

On the other hand, since the second transistor DRT2 formed in the second area A2 in which the camera 120 and the proximity sensor 130 are not disposed does not need to have high transmittance, it may be formed of an LTPS transistor and the substrate 320 may also be formed of color polyimide PI2.

As described above, when the second transistor DRT2 formed in the second area A2 in which the camera 120 and the proximity sensor 130 are not disposed is formed of an LTPS transistor, the color change of the transparent polyimide PI1 and degrade of the performance of the first transistor DRT1 may be prevented in the first area A1 even if the substrate 320 is formed of transparent polyimide PI1 and the first transistor DRT1 is formed of an oxide transistor by the LTPS process in the first area A1 in which the camera 120 or the proximity sensor 130 is disposed.

Accordingly, the substrate 320 may be formed of the transparent polyimide PI1 and the first transistor DRT1 may be made of the oxide transistor in the first area A1 in which the camera 120 or the proximity sensor 130 is disposed. As a result, it is possible to improve the transmittance of the first area A1.

Meanwhile, the oxide transistor mentioned above may be an N-type or P-type transistor. For example, the N-type oxide transistor may include one or more of IZO (Indium Zinc Oxide), IGZO (Indium Gallium Zinc Oxide), ITZO (Indium Tin Zinc Oxide), and the like. Also, the P-type oxide transistor may include one or more of CuOx, SnOx, NiOx and the like.

In addition, the first transistor DRT1 in the first area A1 in which the camera 120 or the proximity sensor 130 is disposed, and the second transistor DRT2 in the second area A2 in which the camera 120 and the proximity sensor 130 are not disposed may be formed on the same layer or different layers.

Here, it illustrates a case that the first transistor DRT1 and the second transistor DRT2 are located on the same active layer ACT. Also, it illustrates that the first node electrode NE1 corresponding to the gate electrode, the second node electrode NE2 and the third node electrode NE3 corresponding to the source-drain nodes are formed on the same layer.

On the other hand, the first transistor DRT1 in the first area A1 in which the camera 120 or the proximity sensor 130 is disposed, and the second transistor DRT2 in the second area A2 in which the camera 120 and the proximity sensor 130 are not disposed may be formed on different layers.

For example, the first transistor DRT1 in the first area A1 in which the camera 120 or the proximity sensor 130 is disposed may be formed over the first active layer ACT on the active-buffer layer ACT-BUF. On the other hand, the second active layer ACT may be formed on the insulating layer INS or the interlayer INT and the second transistor DRT2 may be formed over the second active layer ACT in the second area A2 in which the camera 120 and the proximity sensor 130 are not disposed. As a result, the first node electrode NE1, the second node electrode NE2, and the third node electrode NE3 constituting the second transistor DRT2 may be located at different layer from the first node electrode NE1, the second node electrode NE2, and the third node electrode NE3 constituting the first transistor DRT1.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising:
   a substrate;
   a subpixel layer located over the substrate in a display area, the display area including a first area at least partially overlapping an optical device and a second area not overlapping the optical device;
   a cathode electrode layer including a cathode electrode to which a cathode voltage is applied; and
   an encapsulation layer located on the cathode electrode layer,
   wherein the subpixel layer includes at least one first transistor having a first characteristic and located in the first area, and at least one second transistor having a second characteristic different from the first characteristic and located in the second area, and
   wherein the cathode electrode includes a first portion having a first transmittance in the first area and a second portion having a second transmittance different from the first transmittance in the second area.

2. The display device according to claim 1, wherein the at least one first transistor is an oxide transistor, and the at least one second transistor is a low-temperature polycrystalline silicon transistor.

3. The display device according to claim 1, wherein each of the at least one first transistor and the at least one second transistor serve as driving transistors configured to drive a respective subpixel.

4. The display device according to claim 1, wherein each of the at least one first transistor and the at least one second transistor comprises an active layer disposed over the substrate, a first node electrode disposed on a gate insulating layer disposed on the first active layer, and second and third node electrodes disposed on at least one insulating layer disposed on the first node electrode.

5. The display device according to claim 4, wherein the at least one insulating layer comprises an insulating layer covering the first node electrode and an interlayer disposed on the insulating layer.

6. The display device according to claim 5, wherein the second and third node electrodes contact the active layer through respective triple contact holes formed in the insulating layer, the interlayer, and the gate insulating layer.

7. The display device according to claim 4, further comprising: a planarization layer disposed on the at least one insulating layer; and
   a bank disposed between the cathode electrode layer and an anode electrode of the subpixel layer and having an opening.

8. The display device according to claim 7, wherein the anode electrode contacts the second node electrode through a contact hole formed in the planarization layer.

9. The display device according to claim 7, wherein the third node electrode of the at least one first transistor located in the first area at least partially overlap the opening of the bank.

10. The display device according to claim 1, further comprising:
    a bank disposed between the cathode electrode layer and an anode electrode of the subpixel layer and having an opening; and
    a spacer disposed in a boundary area between the first area and the second area on the bank.

11. The display device according to claim 10, wherein the cathode electrode is disconnected on the spacer.

12. The display device according to claim 11, wherein the portion on the spacer in which the cathode electrode is disconnected is located in a boundary of the cathode electrode disposed in the first area and the cathode electrode disposed in the second area.

13. The display device according to claim 10, wherein the at least one second transistor comprises a first node electrode disposed on a gate insulating layer, and second and third node electrodes contacting an active layer, and
    wherein the third node electrode of the at least one second transistor at least partially overlap the spacer.

14. The display device according to claim 1, wherein the cathode voltage disposed in a portion of the first area not overlapping the at least one transistor has a predetermined transmittance.

15. The display device according to claim 1, wherein a number of subpixels per unit area in the first area is different from a number of subpixels per unit area in the second area.

16. The display device according to claim 15, wherein the number of subpixels per unit area in the first area is less than the number of subpixels per unit area in the second area.

17. The display device according to claim 1, wherein subpixels disposed in the first area are divided into subpixel groups including two or more subpixels, and a separation distance between the subpixel groups is greater than a separation distance between the two or more subpixels included in each of the subpixel group.

18. The display device according to claim 1, wherein the electrical characteristics of the first and second transistors are determined by at least one of a respective length and a respective width of a respective channel.

19. The display device according to claim 1, wherein the optical device is located under the substrate in the display area.

20. The display device according to claim 1, wherein the optical device comprises at least one of a camera and a proximity sensor.

* * * * *